(12) United States Patent
Golubovic et al.

(10) Patent No.: US 8,260,098 B1
(45) Date of Patent: Sep. 4, 2012

(54) OPTOCOUPLER CIRCUIT

(75) Inventors: Dusan Golubovic, Leuven (BE); Gerhard Koops, Aalst (BE); Tony Vanhoucke, Bierbeek (BE); Rob Van Dalen, Bergeijk (NL)

(73) Assignee: NXP B.V., Eindhoven (NL)

( * ) Notice: Subject to any disclaimer, the term of this patent is extended or adjusted under 35 U.S.C. 154(b) by 85 days.

(21) Appl. No.: 13/029,951

(22) Filed: Feb. 17, 2011

(51) Int. Cl.
*G02B 6/12* (2006.01)
*H01L 21/70* (2006.01)
*H01L 21/8238* (2006.01)
*H01L 21/336* (2006.01)
*H01L 21/331* (2006.01)
*H01L 21/76* (2006.01)

(52) U.S. Cl. .......... 385/14; 257/509; 257/544; 438/225; 438/297; 438/362; 438/439

(58) Field of Classification Search .................... 385/14; 257/509, 544
See application file for complete search history.

(56) References Cited

U.S. PATENT DOCUMENTS 5,438,210 A * 8/1995 Worley ........................ 257/82

* cited by examiner

*Primary Examiner* — Uyen Chau N Le
*Assistant Examiner* — Kajli Prince (57) ABSTRACT

An optocoupler device facilitates on-chip galvanic isolation. In accordance with various example embodiments, an optocoupler circuit includes a silicon-on-insulator substrate having a silicon layer on a buried insulator layer, a silicon-based light-emitting diode (LED) having a silicon p-n junction in the silicon layer, and a silicon-based photodetector in the silicon layer. The LED and photodetector are respectively connected to galvanically isolated circuits in the silicon layer. A local oxidation of silicon (LOCOS) isolation material and the buried insulator layer galvanically isolate the first circuit from the second circuit to prevent charge carriers from moving between the first and second circuits. The LED and photodetector communicate optically to pass signals between the galvanically isolated circuits.

20 Claims, 7 Drawing Sheets

OPTOCOUPLER CIRCUIT

Various aspects of the present invention are directed to electronic circuits, and more particularly to monolithically integrated optocoupler circuits.

A variety of circuit devices employ isolation for a variety of purposes. One example type of circuit isolation is galvanic isolation, which allows the exchange of information between two parts of an electric circuit or two electric circuits without the actual flow of charge carriers between them. Galvanic isolation has been used in a variety of circuits, including those having different parts that operate at significantly different voltages in order to protect a lower voltage part, avoid unwanted ground loop bias, and achieve other desirable characteristics.

One type of galvanic isolation circuit is an optocoupler circuit, or chip. Generally, an optocoupler has a light emitting photodiode and a photodetector separated by a transparent dielectric layer. To achieve galvanic isolation using such an approach, optocoupler circuits are often combined with other chips in a package. However, such approaches may not be suitable for many applications for a variety of reasons. For example, such an arrangement may be susceptible to undesirable signal delays due to the paths via which the signals must traverse. In addition, such devices can be relatively complex as well as added complexity/cost associated with interfacing transmitters and receivers via the optocoupler.

Accordingly, the implementation of circuits requiring electrical and/or galvanic isolation continues to be challenging.

Various example embodiments are directed to optocoupler circuits for a variety of applications and addressing various challenges, including those discussed above.

According to an example embodiment, an optocoupler circuit includes a silicon-on-insulator substrate having a silicon layer on a buried insulator layer, and first and second circuits located in the silicon layer and respectively operating at voltages that are at least an order of magnitude different from one another. An insulator is located in a portion of the silicon layer and, with the buried insulator layer, galvanically isolates the first circuit from the second circuit. An optocoupler includes transmitter and receiver circuits in the silicon layer. The transmitter circuit is electrically connected to one of the first and second circuits, and transmits an optical signal based upon an electrical signal received from the one of the first and second circuits. The receiver circuit is electrically connected to the other one of the first and second circuits, and receives the optical signal communicated from the transmitter circuit, and communicates an electrical signal to the other one of the first and second circuits based upon the received optical signal.

Another example embodiment is directed to an optocoupler circuit having a silicon-on-insulator substrate with a silicon layer on a buried insulator layer, a silicon-based light-emitting diode (LED) and a silicon-based photodetector. The LED has a silicon p-n junction in the silicon layer and connected to a first circuit in the silicon layer, with the silicon p-n junction being configured to operate in a forward-biased state. The silicon-based photodetector is also located in the silicon layer and is connected to a second circuit in the silicon layer. A local oxidation of silicon (LOCOS) isolation material includes an oxidized portion of the silicon layer, and is configured with the buried insulator layer to galvanically isolate the first circuit from the second circuit to prevent charge carriers from moving therebetween. A waveguide optically couples the LED and photodetector for passing an optical signal from the LED to the photodetector to facilitate communications between the galvanically-isolated first and second circuits.

Another example embodiment is directed to a method for manufacturing an optocoupler device on a silicon-on-insulator (SOI) substrate having a silicon layer on a buried insulator. A silicon-based light-emitting diode (LED) having a silicon p-n junction is formed in the silicon layer and connected to a first circuit in the silicon layer, the silicon p-n junction being configured to operate in a forward-biased state. A silicon-based photodetector is also formed in the silicon layer and connected to a second circuit in the silicon layer. A portion of the silicon layer is oxidized using a local oxidation of silicon (LOCOS) process to form a LOCOS insulation material that, with the buried insulator layer, galvanically isolates the first circuit from the second circuit to prevent charge carriers from moving between the first and second circuits. A waveguide is formed optically coupling the LED and photodetector for passing an optical signal from the LED to the photodetector to facilitate communications between the galvanically-isolated first and second circuits.

The above discussion is not intended to describe each embodiment or every implementation of the present disclosure. The figures and following description also exemplify various embodiments.

Various example embodiments may be more completely understood in consideration of the following detailed description in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. Furthermore, the term "example" as used throughout this document is by way of illustration, and not limitation.

The present invention is believed to be applicable to a variety of different types of circuits, devices and arrangements involving optocouplers. While the present invention is not necessarily limited in this context, various aspects of the invention may be appreciated through a discussion of various related examples.

According to an example embodiment, an optocoupler is incorporated on a single integrated circuit chip, for optically communicating between electrically isolated circuits in the chip. The optocoupler includes an optical transmitter and an optical receiver that optically communicate with one another and respectively communicate with different ones of the electrically isolated circuits. This optical communication facilitates communications between the electrically isolated circuits.

Another example embodiment is directed to an optocoupler circuit in which a transmitter and a receiver (or transceivers) are connected to electrically isolated circuits in an integrated circuit chip. The optocoupler circuit facilitates optical communications between the isolated circuits, while electrical isolation between the isolated circuits is maintained.

The transmitters and receivers as discussed above are respectively connected to electrical circuits in the chip, communicate with the electrical circuit connected thereto, and further communicate signals sent to and/or received from another receiver, transmitter or transceiver. The optocoupler and/or other portions of the chip generate optical signals based on electrical signals for transmission, and generate electrical signals based on optical signals for reception. Accordingly, the integrated circuit portions that are electrically isolated from one another may communicate with one another via an optical communication path, while maintaining electrical isolation. In addition, the respective circuit portions and optical transmitter/receiver/transceiver may be fabricated on a common chip (e.g., with one or more components formed simultaneously), which can be beneficial for a variety of implementations, such as to facilitate the combination of manufacturing steps, reduction of cost, or simplification of products.

Another example embodiment is directed to a method for manufacturing an optocoupler device. Separate circuits are formed in disparate portions of a semiconductor chip. An optocoupler transmitter is connected to one of the circuits, and an optocoupler receiver is connected to the other one of the integrated circuits. An electrical isolation material is formed to electrically isolate the separate circuits from one another, and also to electrically insulate the optocoupler transmitter and receiver. An optical conduit or medium may optionally be formed to facilitate optical coupling of the transmitter and receiver.

The various embodiments discussed herein are applicable to implementation in a variety of manners. In some embodiments, the optocoupler device is formed in a silicon layer of a silicon-on-insulator (SOI) wafer. A buried oxide layer (the insulator portion of the SOI wafer) is formed having a thickness to suitably provide electrical isolation as discussed herein. For example, an oxide thickness of about 1 µm can be used to provide on-chip isolation for 500 V operation, and an oxide thickness of about 4 µm can be used to provide on-chip isolation for 2000V operation. In other embodiments, an optocoupler as discussed herein is implemented using the A-BCD (Advanced Bipolar-CMOS-DMOS) or the EZ-HV wafer (and process for the production of commercial high-voltage silicon-on-insulator (HV-SOI) ICs)), available from NXP Semiconductors of Eindhoven, The Netherlands. Such approaches can be implemented, for example, to incorporate high-voltage circuits that can handle rectified AC line supply voltages, as well as low-voltage CMOS logic to provide on-chip intelligence.

In some implementations, the silicon layer of the SOI wafer has a thickness that mitigates avalanche breakdown. For example, by limiting the thickness to one micron or a few microns, the ability of charge carriers in the silicon layer to accelerate to an energy at which avalanche breakdown occurs is inhibited. Using this approach together with the integrated optocoupler and circuit isolation within the silicon layer and via the underlying buried insulator, a circuit operating at high voltage can be integrated and isolated from circuits operating at lower voltage.

In connection with various example embodiments, an optocoupler circuit such as described herein includes an insulating material that is used to galvanically isolate integrated circuits fabricated using silicon-on-insulator (SOI) wafers (e.g., for operation at voltage ranges up to 2000V). The SOI device can be implemented in vehicle-type communications systems such as the local interconnect network (LIN) or the controller-area network (CAN) as standalone transceivers, as well as LIN/CAN system basis chips (e.g., with communication data rate that do not exceed 20-30 Mbps).

As commensurate with various example embodiments, an insulator as discussed herein is configured to galvanically isolate circuits by preventing charge carriers from moving between circuits. In many embodiments, the grounds of each of the galvanically isolated circuits are at different potentials. The respective isolated circuits can be operated at potentials that are an order of magnitude different than one another.

Electrical (e.g., galvanic) isolation between disparate portions of a chip communicatively coupled via an optocoupler is effected using one or more of a variety of approaches. In some implementations, LOCOS (local oxidation of silicon) isolation is used in connection with the buried oxide to achieve full dielectric isolation of the respective circuit portions. The width, thickness and other characteristics of the LOCOS are set to suit particular applications. In some implementations, the width of the LOCOS is set to about 4 µm wide for application with voltages of 2000V (e.g., as commensurate with the above-referenced example thickness of the buried oxide in the SOI structure). In certain implementations, the thickness of LOCOS $t_{LI}$ is determined by the selected thickness of the SOL as back-end-of-line isolation layers, used for the formation of metallization, are used to attain sufficient dielectric isolation.

Communication circuits used in connection with the optocouplers as discussed herein may include one or more of a variety of components. In some embodiments, a photodiode, photodetector and optical waveguide are implemented using planar silicon-based fabrication technology, to respectively form a transmitter, receiver and optical link for the optocoupler. As other examples, transmitters such as a laser, light-emitting diode (LED), or other light-producing circuit can be used. Similarly, light receivers may employ circuits such as a photo multiplier tube, photo transistor or avalanche photo-diode to detect light. Various embodiments are directed to a transmitter/receiver combination of silicon-based light emitting diodes and photodetectors. Optical links such as a fiber optic cable, waveguide, or a medium such as air or other fluid may be used as the optical waveguide.

In some embodiments, an optical receiver as discussed herein includes a p-i-n photodetector implemented using implants in a CMOS process. For instance, a photodiode can be implemented using n+/n-well/p-substrate or p+/n-well/p-substrate, such as used in CMOS image sensors. Implant layers used in other standard CMOS processes can also be used.

A silicon-based LED is used as an optical transmitter in various embodiments, with the optocoupler circuit configured to stress a silicon p-n junction in the LED to modify the bandgap, facilitating efficient light generation in a forward-biased operation mode. In some implementations, the stress is realized by using plasma-enhanced chemical vapor deposition of silicon nitride, or by intentionally inducing dislocation loops on one side of the p-n junction of the LED. This approach can be used to mitigate efficiency issues with such diodes as related to an indirect bandgap, as well as high free carrier absorption.

In some implementations, a waveguide used to optically link the transmitter and receiver portions of an optocoupler as discussed herein includes a silicon nitride material having a relatively high refractive index (e.g., $n_{SiN} \approx 2$), to facilitate total (or near total) internal reflection. Light transmitted from the transmitter (e.g., an LED) into the waveguide can be efficiently confined in the waveguide and transmitted to the receiver (e.g., a photodetector) without significant losses. Moreover, due to the confinement of light in the waveguide, adverse effects such as those associated with on-chip emitted radiation can be mitigated or otherwise minimized.

Figure 1:
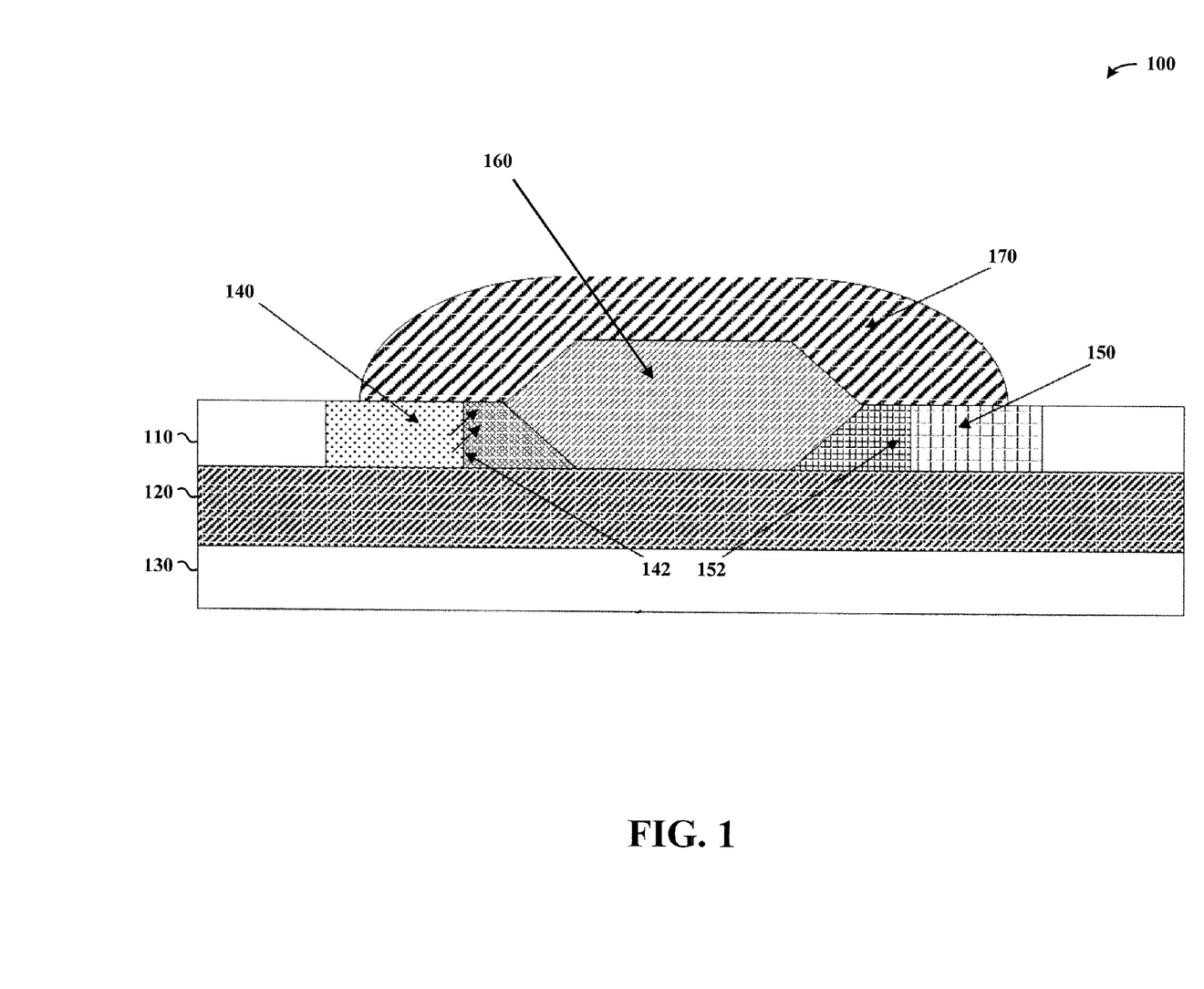
FIG. 1 shows an optocoupler having light emitting diode (LED) and photodetector, according to an example embodiment of the present invention.

Turning now to the Figures, FIG. 1 shows an optocoupler circuit 100, in accordance with another example embodiment. The optocoupler circuit 100 includes a silicon-on-insulator structure including a silicon layer 110 on a buried insulator 120, over a silicon substrate 130. A photodiode 140 (e.g., a light emitting diode (LED)) and photodetector 150 are formed in the silicon layer 110, and separated by a LOCOS insulator 160. The photodiode 140 and photodetector 150 respectively have p-n junctions 142 and 152 via which light is generated from an electrical input, and via which an electrical output is generated from light. Light is passed from the photodiode 140 to the photodetector 150 through a waveguide type of material 170. The LOCOS 160 and the buried insulator 120 serve to galvanically isolate the respective circuit portions of the photodiode 140 and photodetector 150, and other circuitry connected thereto (e.g., at laterally adjacent portions of the silicon layer 110). In this context, high voltage circuits on one side of the LOCOS 160 (e.g., at the photodetector 150) can be galvanically isolated from lower voltage circuits operating at another side of the LOCOS 160 (e.g., at photodiode 140). Voltages of an order of magnitude (or more) in difference can be electrically, and galvanically, isolated in this manner.

The photodiode 140 and photodetector 150 can be formed using one or more of a variety of approaches, to suit different applications. For example, implantations of doping species such as Boron, Arsenic, and Phosphorous can be used to form the respective photodiode/photodetector pair 140 and 150, and respective p-n junctions. The implantations can be done specifically to form the photodiode 140 and photodetector 150, or as part of available implantation conditions used for the fabrication of surrounding integrated circuits. The implant materials and related approach can be implemented to achieve desired properties of the photodiode and photodetector, as well as upon the implant availability in the selected process platform.

The waveguide 170 can also be formed using one or more of a variety of materials that facilitate the communication of optical signals between the photodiode 140 and photodetector 150. In some implementations, the waveguide 170 is a silicon nitride (SiN) material formed on the LOCOS 160 to optically connect the photodiode 140 and photodetector 150. The optically active junctions 142 and 152 are offset from the edge of the LOCOS isolation 160 to reduce, or minimize, the influence of defects formed during a heavy thermal oxidation.

In some implementations, the SiN waveguide 170 is used as a stress layer to modify the bandgap of the photodiode 140, to achieve efficient light generation in a forward-biased operation mode. In other implementations, an additional SiN layer can be deposited at the photodetector 140 to achieve bandgap modification.

Figure 2:
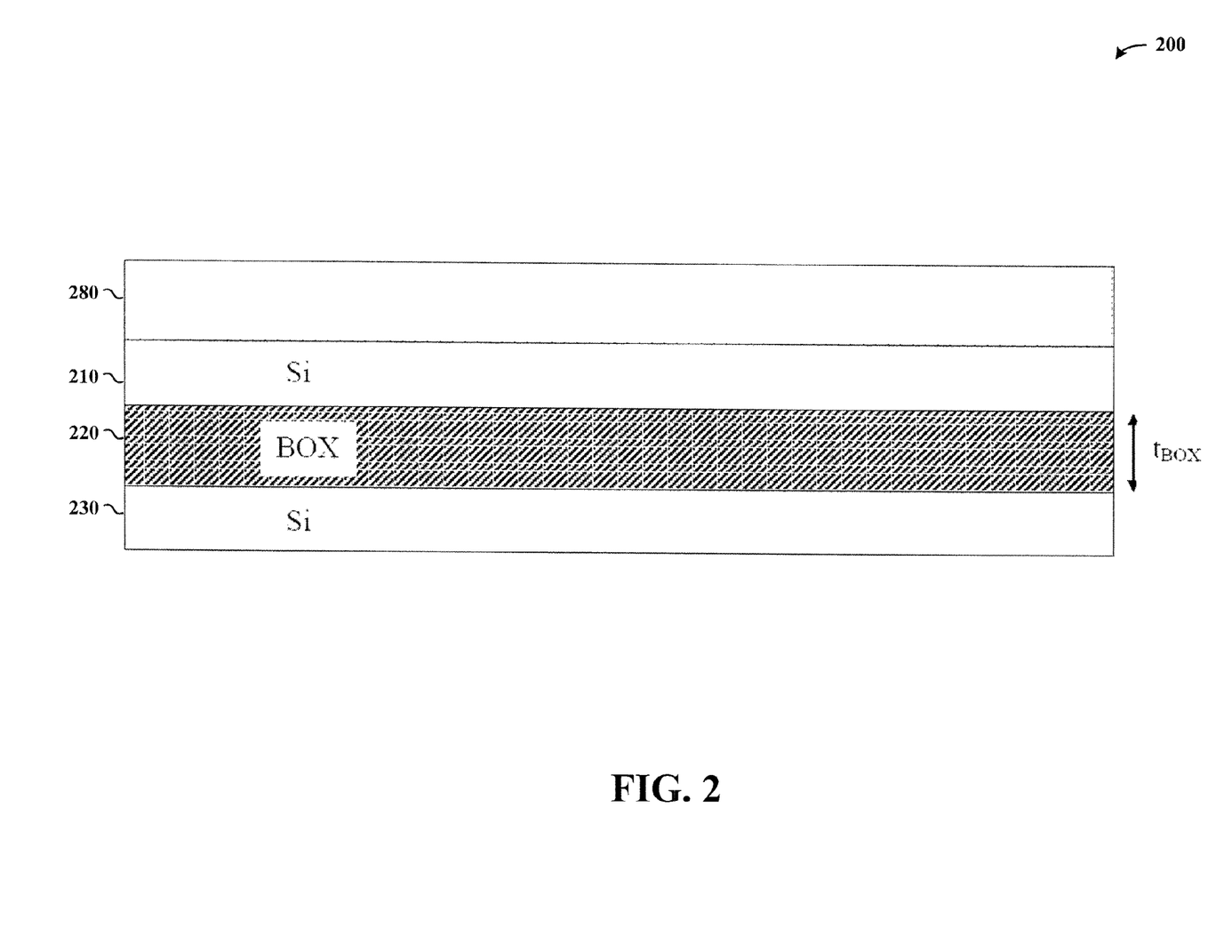
FIG. 2 shows an optocoupler at a first stage of manufacture, with an SOI wafer and a buried oxide (BOX) covered with a hard mask, according to another example embodiment of the present invention.

FIGS. 2-5 show an optocoupler circuit 200 at various stages of manufacture, in accordance with other example embodiments. The optocoupler circuit 200 and related approaches described herein may, for example, be used to form the optocoupler circuit 100 shown in FIG. 1. In this context, FIGS. 2-5 use reference numbers that are similar to those used in FIG. 1 (e.g., buried oxide layer 220 in FIG. 2 is labeled similarly to 120 and 220), for illustration.

Referring to FIG. 2, an optocoupler 200 is shown at a first stage of manufacture, with an SOI wafer having a silicon layer 210 on a buried oxide (BOX) layer 220, over a substrate 230 (e.g., silicon), in accordance with another example embodiment of the present invention. The silicon layer 210 is covered with a hard mask 280, including materials such as a thin silicon pad-oxide (at the interface with the silicon layer 210) and silicon nitride. The thickness of hard mask 280 and layers (e.g., SiN) therein are set to provide protection of the underlying silicon layer 210 against thermal oxidation. The thickness of the buried oxide 220, represented by arrows as $t_{BOX}$, can be set to achieve desired galvanic isolation of separated circuit portions, in a manner as discussed elsewhere herein.

Figure 3:
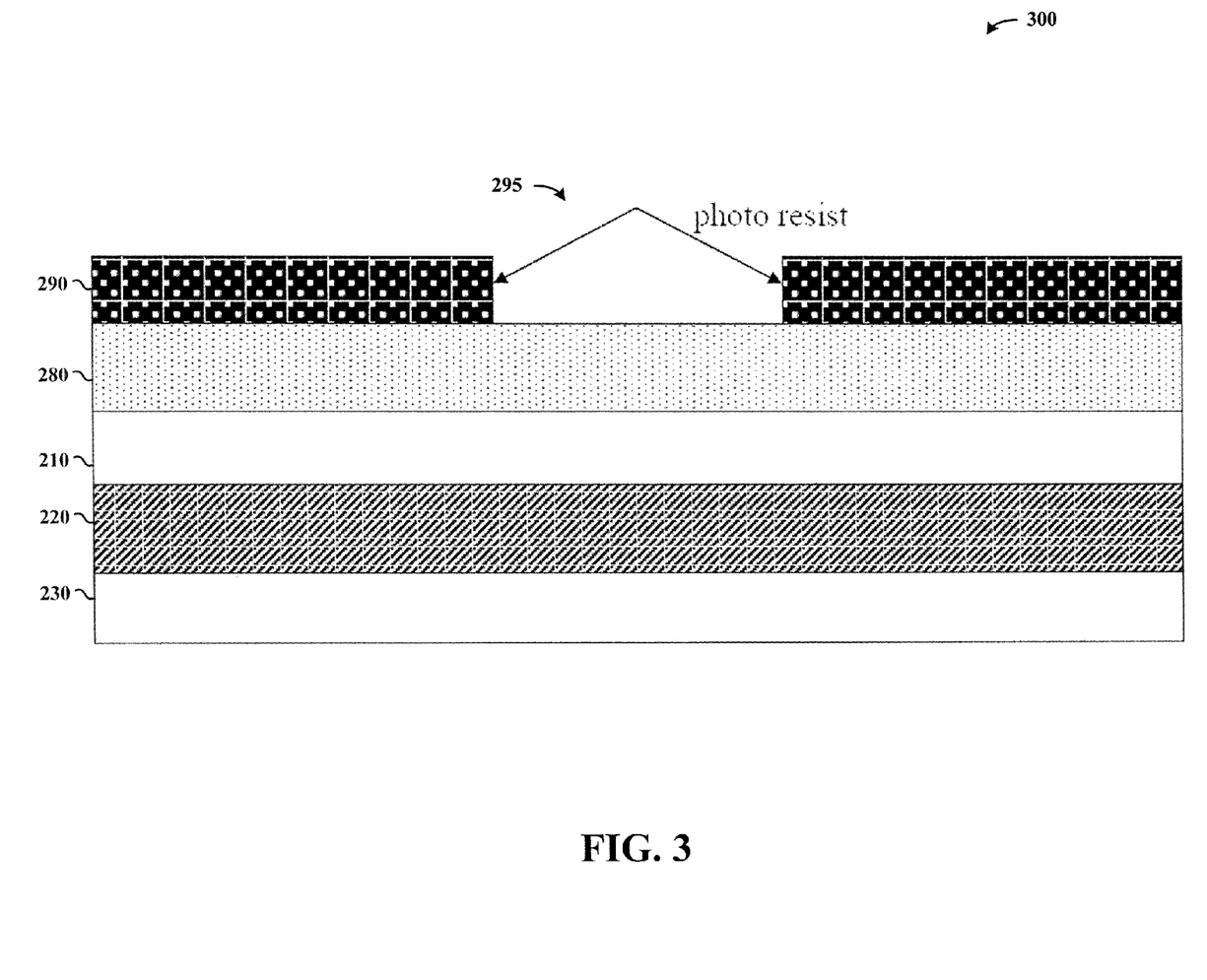
FIG. 3 shows an optocoupler at another stage of manufacture, involving a photo step that defines SOI areas to be exposed to LOCOS (local oxidation of silicon) oxidation, according to another example embodiment of the present invention.

FIG. 3 shows an optocoupler 300 at another stage of manufacture, in connection with another example embodiment. A photo resist layer 290 has been formed on hard mask layer 280 and over an underlying SOI wafer, such as shown in FIG. 2. The photo resist layer 290 has been patterned to expose an opening at 295, leaving separated resist portions shown by way of arrows in the opening. The photo resist patterning defines areas of the silicon layer 210 in the SOI wafer to be exposed to LOCOS oxidation, for galvanically isolating circuits therein.

The width of the opening at 295, and corresponding structure of the separate portions of the photo resist layer 290, are set to achieve desired galvanic isolation. This may, for example, involve setting the width of the opening 295 to correspond with a particular operating voltage of one or more circuits to be galvanically isolated, such as described elsewhere in this document. In some implementations, the width of the opening 295 is determined using the same criterion as used to set the thickness of the buried oxide 220 ($t_{BOX}$) as discussed above, which may also be set according to an expected application and desired galvanic isolation.

Figure 4:
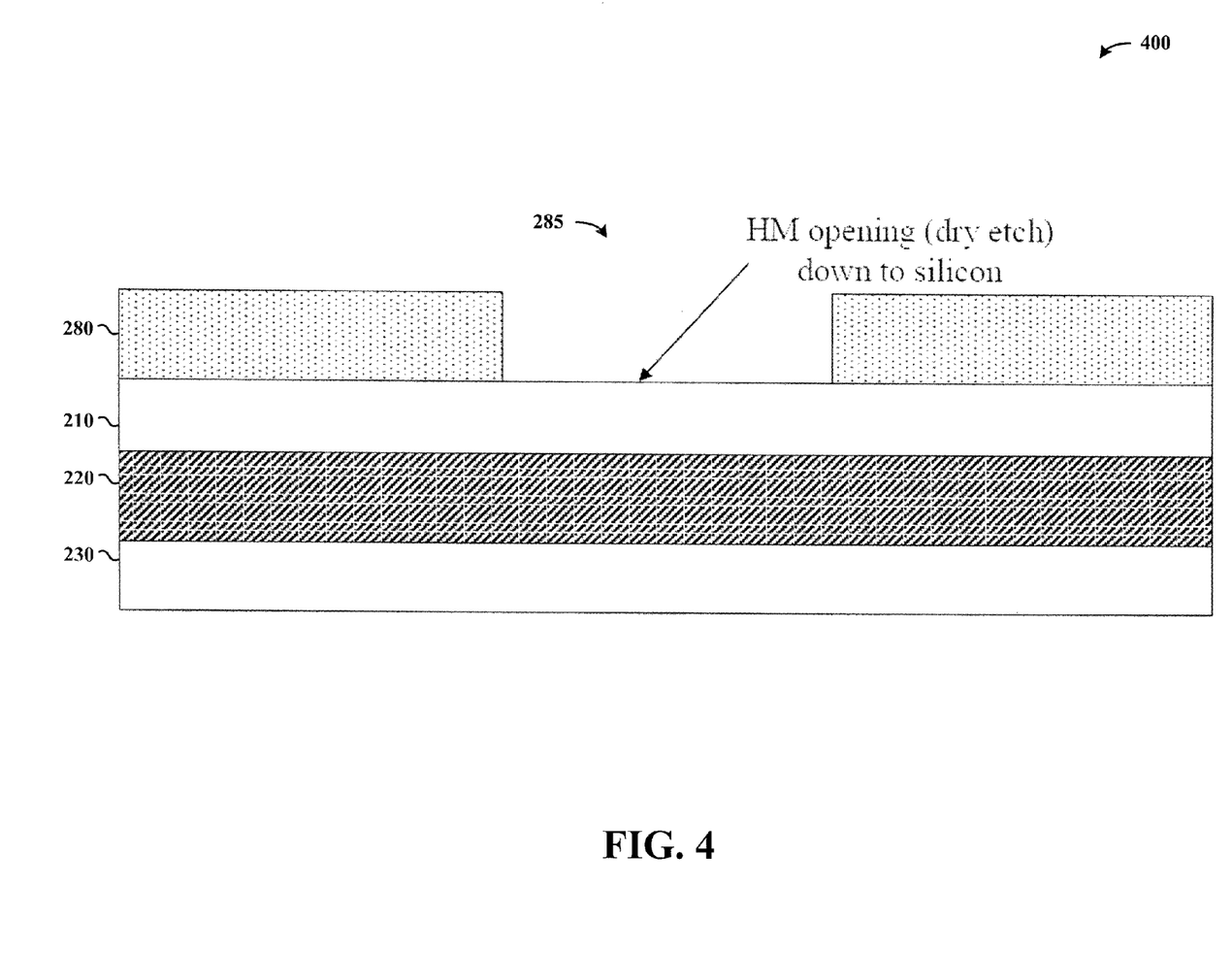
FIG. 4 shows an optocoupler at another stage of manufacture, in which a hard mask is removed by dry etching areas to be oxidized, according to another example embodiment of the present invention.

FIG. 4 shows an optocoupler 400 at another stage of manufacture, according to another example embodiment of the present invention. A portion of a hard mask layer 280 has been removed at 285, to expose a portion of silicon layer 210. In some implementations, the portion of the hard mask layer 280 is removed by dry etching areas to be oxidized using a photoresist 290 patterned as shown in FIG. 3. The dry etch is selective, such that the etch stops at the silicon layer 210 of the SOI wafer.

Figure 5:
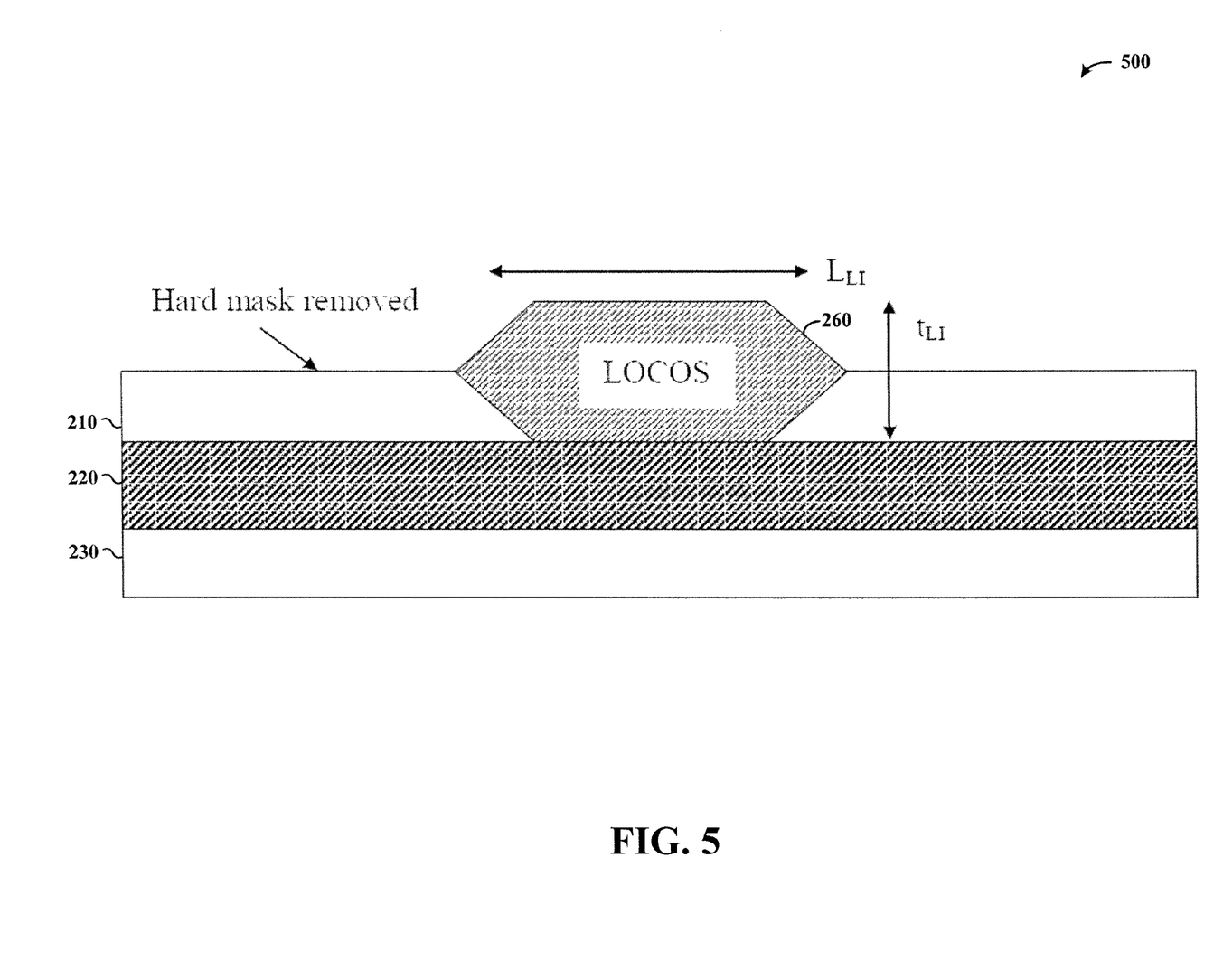
FIG. 5 shows an optocoupler at another stage of manufacture, in which thermal oxide is locally grown using a LOCOS process on a SOI wafer to merge with an underlying BOX, according to another example embodiment of the present invention.

FIG. 5 shows an optocoupler 500 at another stage of manufacture, according to another example embodiment of the present invention. As may be implemented relative to FIG. 4, a thermal oxide 260 is locally grown using a LOCOS process in silicon layer 210 of a SOI wafer, to merge with an underlying buried oxide 220. A hard mask, such as mask 280 in FIG. 4, can be used to limit the oxidation of the LOCOS process and set the length $L_{LI}$ of the thermal oxide 260. The optocoupler 500 is shown with any such hard mask having been removed, leaving behind the SOI wafer with galvanically-isolated regions of silicon layer 210.

One or both of the length $L_{LI}$ and thickness $T_{LI}$ can be set in accordance with the aforementioned oxide thickness versus breakdown voltage criterion. In some implementations, back-end-of-line dielectric isolation is used after the LOCOS process to reach a desired thickness. In other implementations, shallow trench isolation is used to provide lateral isolation.

Figure 6:
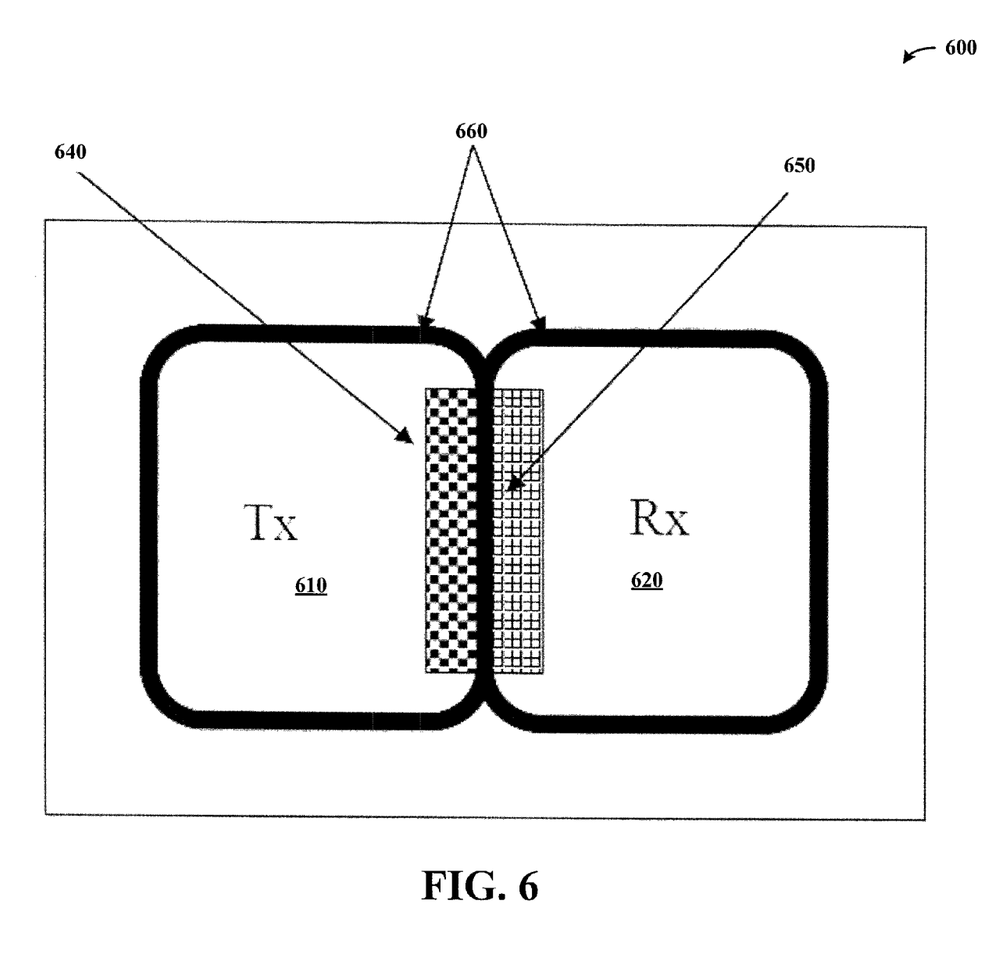
FIG. 6 shows a top view of an optocoupler, according to another example embodiment of the present invention.

FIG. 6 shows a top view of an optocoupler device 600, according to another example embodiment of the present invention. The device includes transmitter (Tx) portion 610 and receiver (Rx) portion 620, which are each enclosed in an isolation material 660 such as LOCOS isolation described above. The transmitter portion 610 includes a light-emitting diode 640, and the receiver 620 includes a photodetector 650 that is separated from the light-emitting diode by the isolation material. The LED 640 and photodetector 650 are respectively coupled to other circuits in the transmitter and receiver portions 610 and 620 that operate at disparate voltages.

The isolation material 660 is configured with an underlying insulator to galvanically isolate the transmitter portion 610 and receiver portion 620 from one another, to facilitate operation of circuits in each portion at the aforesaid disparate voltages. While shown surrounding the respective transmitter 610 and receiver 620, the isolation material 660 can be formed in other manners. For example, the isolation material 660 can be limited to portions of the device 600 that are between the transmitter and receiver 610/620 portions, in applications for which these portions are otherwise galvanically isolated (e.g., via the edge of a chip, or trench isolation regions).

Figure 7:
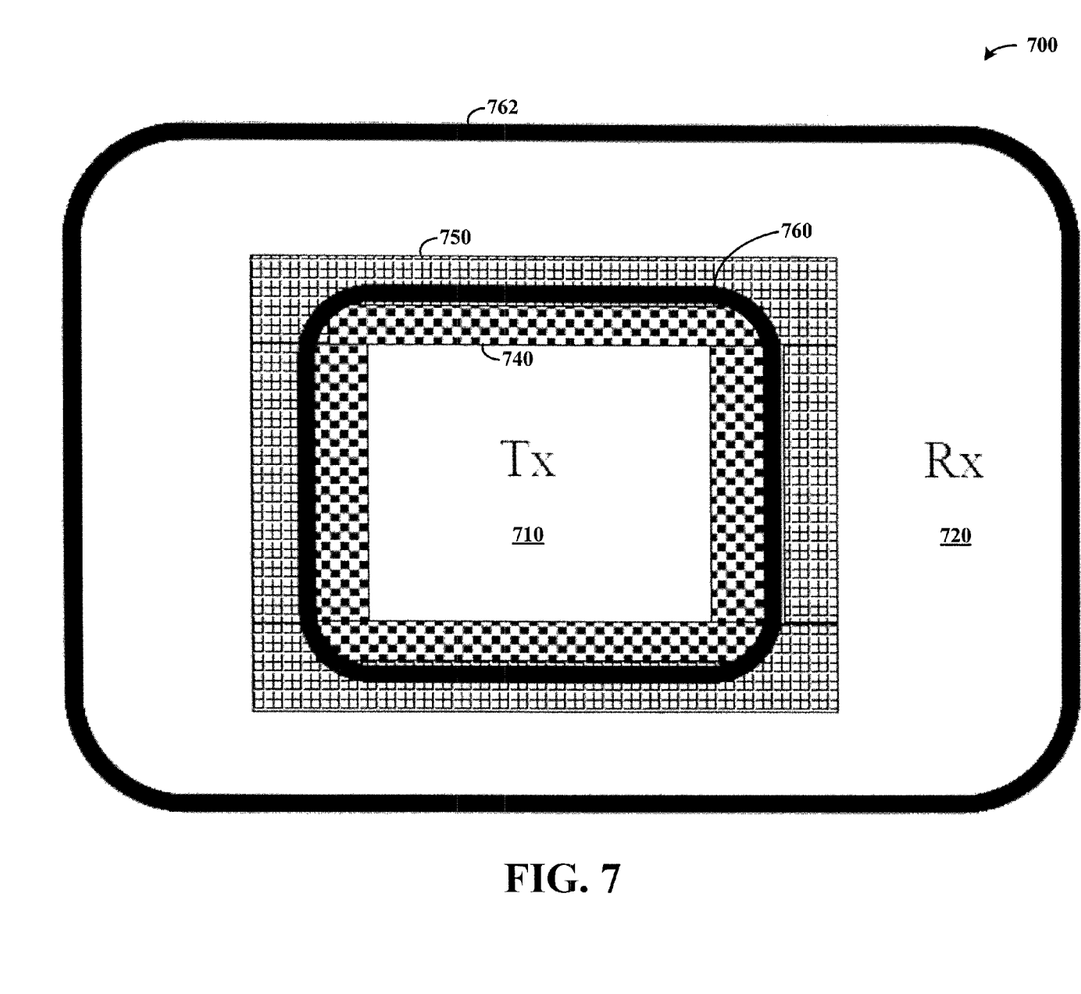
FIG. 7 shows another top view of an optocoupler, according to another example embodiment of the present invention.

FIG. 7 shows a top view of another optocoupler device 700, according to another example embodiment of the present invention. The device 700 includes transmitter (Tx) 710 and receiver (Rx) 720 portions, galvanically isolated from one another by an isolation material 760 and an underlying insulator (e.g., in a SOI structure as discussed above). The transmitter 710 includes a light-emitter 740, and the receiver 720 includes a light detector 750, such as described above.

The emitter/detector pair 740/750 facilitate optical communications between electric circuits within galvanically isolated portions of the device 700, with the optical communications being passed between the emitter/detector to facilitate communication between the electrical circuits therein. For example, low-voltage control circuitry in the transmitter portion 710 can be used to control the operation of high-voltage circuitry in the receiver portion 720, via optical communication between the emitter/detector pair 740/750.

Various embodiments are directed to the integration of optocoupler circuits such as described herein and/or shown in the figures, in connection with one or more of a variety of systems. For example, some embodiments are directed to implementation of an optocoupler with lighting systems. Control logic and high voltage drive circuits can be integrated into a single integrated circuit, facilitating the integration of low-power applications with high-voltage power switching transistors integrated on-chip. This approach can be used, for example, in single-chip compact fluorescent lamp (CFL) controllers. For example, this approach can be used for driver circuits and power switching transistors used in 110-volt single-chip full-bridge CFL or High Intensity Discharge (HID) lamp drivers. Other lighting applications include high frequency tube lighting (HFTL), low-voltage halogen, and LCD backlighting systems.

In other embodiments, an optocoupler as discussed herein is used in smart charger devices that directly handle rectified AC line supply voltages, for battery charging and power management for a variety of products. For example, cordless shavers, cellular telephones, cordless telephones, and other hand-held devices can be powered using a single-chip system-on-silicon solution circuit as discussed herein. Power conversion is controlled in response to the battery condition and load current demand, while at the same time predicting battery life until the next charge.

Other embodiments are directed to power supply devices and systems such as a switchmode power supply (SMPS) systems employing an optocoupler as discussed herein. High-voltage control circuits are integrated into a chip also housing high-voltage circuits, with the control circuits operating at a relatively low voltage. For certain applications, high-voltage drivers and switching transistors are combined with analog and digital control circuitry on a single chip for active power factor correction with power supplies.

Flat-screen displays such as those used for monitors and televisions include an optocoupler circuit as discussed herein, in connection with other example embodiments. High voltage driver circuits are integrated with lower-voltage control circuits in a common chip, with the lower voltage circuits electrically isolated from the high voltage circuits.

Based upon the above discussion and illustrations, those skilled in the art will readily recognize that various modifications and changes may be made to the present invention without strictly following the exemplary embodiments and applications illustrated and described herein. For example, different types of insulated substrates, different circuit/chip arrangements, or different positioning of transmitters and receivers (e.g., as exemplified in FIGS. 6 and 7). Such modifications do not depart from the true spirit and scope of the present invention, including that set forth in the following claims.

What is claimed is:

1. An integrated optocoupler circuit comprising:
   a silicon-on-insulator substrate having a silicon layer on a buried insulator layer;
   first and second circuits located in the silicon layer and respectively operating at voltages that are at least an order of magnitude different from one another;
   an insulator in a portion of the silicon layer, the insulator and the buried insulator layer being configured to galvanically isolate the first circuit from the second circuit; and
   an optocoupler including
      a transmitter circuit electrically connected to one of the first and second circuits, and configured to transmit an optical signal based upon an electrical signal received from the one of the first and second circuits, and
      a receiver circuit electrically connected to the other one of the first and second circuits, and configured to receive the optical signal communicated from the transmitter circuit and to communicate an electrical signal to the other one of the first and second circuits, based upon the received optical signal; and
      a waveguide optically coupling the transmitter circuit and the receiver circuit thereby facilitating communications between them.

2. The integrated opotocoupler circuit of claim 1, wherein the insulator and the buried insulator layer are configured to galvanically isolate the first circuit from the second circuit by preventing charge carriers from moving between circuits.

3. The integrated opotocoupler circuit of claim 1, further including
   a second transmitter circuit electrically connected to the other one of the first and second circuits, and configured to transmit an optical signal based upon an electrical signal received from the other one of the first and second circuits, and
   a second receiver circuit electrically connected to the one of the first and second circuits, and configured to receive the optical signal communicated from the second transmitter circuit and to communicate an electrical signal to the one of the first and second circuits, based upon the received optical signal.

4. The integrated opotocoupler circuit of claim 1, wherein one of the first and second circuits operates at a high voltage,
the other one of the first and second circuits operates at a low voltage and is susceptible to circuit damage upon exposure to the high voltage, and
the insulator is configured to galvanically isolate the other one of the first and second circuits from the high voltage.

5. The integrated optocoupler circuit of claim 1, wherein the first circuit, the second circuit and the optocoupler are formed in at least a portion of the silicon layer, and said insulator and the buried insulator layer of the silicon-on-insulator substrate galvanically isolate the first and second circuits from one another.

6. The integrated optocoupler circuit of claim 1, wherein the silicon layer is sufficiently thin to mitigate the acceleration of charge carriers between upper and lower surfaces of the silicon layer to an energy level at which avalanche breakdown occurs,
the first circuit, the second circuit and the optocoupler are formed in at least a portion of the silicon layer, and said insulator and the buried insulator layer of the silicon-on-insulator substrate galvanically isolate the first and second circuit s from one another.

7. The integrated opotocoupler circuit of claim 1, wherein the insulator includes a local oxidation of silicon (LOCOS) isolation material that includes an oxidized portion of a silicon layer in which the first and second circuits are formed, that galvanically isolates the first and second circuits from one another.

8. The integrated opotocoupler circuit of claim 1, wherein the insulator includes a local oxidation of silicon (LOCOS) isolation material that is configured to galvanically isolate the first and second circuits from one another under conditions in which one of the circuits operates at a voltage of at least about 2000 V.

9. The integrated opotocoupler circuit of claim 1, wherein the first circuit, the second circuit and the optocoupler are formed in at least a portion of the silicon layer, and
the insulator includes a local oxidation of silicon (LOCOS) isolation material in the silicon layer, the thickness of the LOCOS material being the same as the thickness of the buried insulator layer.

10. The integrated opotocoupler circuit of claim 1, wherein the transmitter circuit includes a silicon-based light emitting diode, and
the receiver includes a silicon-based photodetector.

11. The integrated opotocoupler circuit of claim 1, wherein the transmitter and receiver circuits include implanted portions of a silicon layer of the silicon-on-insulator substrate, and the insulator galvanically isolates the respective implanted portions of the silicon layer that form the transmitter and receiver circuits.

12. The integrated opotocoupler circuit of claim 1, wherein the transmitter circuit includes a silicon-based light-emitting diode having a silicon p-n junction with a bandgap modified for operation in a forward-biased state.

13. The integrated opotocoupler circuit of claim 1, wherein the transmitter circuit includes a silicon-based light-emitting diode having a silicon p-n junction configured to operate in a forward-biased state, and having a bandgap modified by silicon nitride deposited via plasma-enhanced chemical vapor deposition.

14. The integrated opotocoupler circuit of claim 1, wherein the transmitter circuit includes a silicon-based light-emitting diode having a silicon p-n junction configured to operate in a forward-biased state, further comprising a silicon nitride material configured to modify the bandgap of the p-n junction to operate the p-n junction in a forward-biased state.

15. The integrated opotocoupler circuit of claim 1, wherein the transmitter circuit includes
a silicon-based light-emitting diode having a silicon p-n junction configured to operate in a forward-biased state, and
dislocation loops on one side of the p-n junction that modify the bandgap of the p-n junction.

16. An optocoupler circuit comprising:
a silicon-on-insulator substrate having a silicon layer on a buried insulator layer;
a silicon-based light-emitting diode (LED) having a silicon p-n junction in the silicon layer and connected to a first circuit in the silicon layer, the silicon p-n junction being configured to operate in a forward-biased state;
a silicon-based photodetector in the silicon layer and connected to a second circuit in the silicon layer;
a local oxidation of silicon (LOCOS) isolation material that includes an oxidized portion of the silicon layer, the LOCOS isolation material and the buried insulator layer being configured to galvanically isolate the first circuit from the second circuit to prevent charge carriers from moving between the first and second circuits; and
a waveguide optically coupling the LED and photodetector for passing an optical signal from the LED to the photodetector to facilitate communications between the galvanically-isolated first and second circuits.

17. The opotocoupler circuit of claim 16, further including silicon nitride material adjacent the p-n junction and configured to modify the bandgap of the p-n junction.

18. A method for manufacturing an optocoupler device on a silicon-on-insulator (SOI) substrate having a silicon layer on a buried insulator, the method comprising:
forming a silicon-based light-emitting diode (LED) having a silicon p-n junction in the silicon layer and connected to a first circuit in the silicon layer, the silicon p-n junction being configured to operate in a forward-biased state;
forming a silicon-based photodetector in the silicon layer and connected to a second circuit in the silicon layer;
oxidizing a portion of the silicon layer using a local oxidation of silicon (LOCOS) process to form a LOCOS insulation material configured, with the buried insulator layer, to galvanically isolate the first circuit from the second circuit to prevent charge carriers from moving between the first and second circuits;
forming a waveguide optically coupling the LED and photodetector for passing an optical signal from the LED to the photodetector to facilitate communications between the galvanically-isolated first and second circuits.

19. The method of claim 18, wherein forming a silicon-based LED includes depositing silicon nitride material at the p-n junction via plasma-enhanced chemical vapor deposition to modify the bandgap of the LED to configure the LED to operate in a forward-biased state.

20. The method of claim 18, wherein forming a silicon-based LED includes forming dislocation loops at a p-n junction of the LED to modify the bandgap of the p-n junction and configure the p-n junction to operate in a forward-biased state.

* * * * *